United States Patent
Li

(10) Patent No.: US 8,735,725 B2
(45) Date of Patent: May 27, 2014

(54) SIGNAL TRANSMISSION LINE DISPOSED WITH CONDUCTIVE PLASTIC MATERIAL LAYER

(75) Inventor: Huabing Li, Guangdong (CN)

(73) Assignee: Shenzhen Luxshare Precision Industry Co., Ltd., Shenzhen, Guangdong (CN)

( * ) Notice: Subject to any disclaimer, the term of this patent is extended or adjusted under 35 U.S.C. 154(b) by 187 days.

(21) Appl. No.: 13/470,879

(22) Filed: May 14, 2012

(65) Prior Publication Data

US 2013/0233592 A1 Sep. 12, 2013

(30) Foreign Application Priority Data

Mar. 6, 2012 (CN) .......................... 2012 1 0056653

(51) Int. Cl.
*H01B 7/18* (2006.01)
*H01B 3/30* (2006.01)
*H01B 7/00* (2006.01)

(52) U.S. Cl.
USPC ................. 174/107; 174/110 R; 174/113 R; 174/119 R

(58) Field of Classification Search
USPC ........................ 174/107, 110 R, 113 R, 119 R
See application file for complete search history.

(56) References Cited

U.S. PATENT DOCUMENTS

| | | | | | |
|---|---|---|---|---|---|
| 3,595,982 A | * | 7/1971 | Kafka | .......................... | 174/15.5 |
| 4,317,955 A | * | 3/1982 | Choi | .......................... | 174/126.2 |
| 5,565,653 A | * | 10/1996 | Rofidal et al. | ............ | 174/113 R |
| 2004/0026114 A1 | * | 2/2004 | Hsieh | ......................... | 174/117 F |
| 2007/0199731 A1 | * | 8/2007 | Wasiuta | ........................ | 174/113 R |
| 2008/0314613 A1 | * | 12/2008 | Huang et al. | .................. | 174/107 |
| 2010/0051318 A1 | * | 3/2010 | Wang | ........................ | 174/113 R |

* cited by examiner

*Primary Examiner* — Timothy Thompson
*Assistant Examiner* — Sherman Ng
(74) *Attorney, Agent, or Firm* — Hamre, Schumann, Mueller & Larson, P.C.

(57) ABSTRACT

A signal transmission line disposed with a conductive plastic material layer is provided, which relates to the field of signal transmission line technologies, and specifically to electromagnetic interference (EMI) protection of the signal transmission line. The signal transmission line at least includes a metal wire disposed with an insulation layer, a conductive plastic material layer is disposed outside the metal wire disposed with the insulation layer, and an insulation outer coating layer is disposed outside the conductive plastic material layer. A conductive plastic material layer is used as a shielding layer for EMI protection. The conductive plastic material is also called conductive polymer plastic and has characteristics such as good conductivity and good antistatic property.

7 Claims, 1 Drawing Sheet

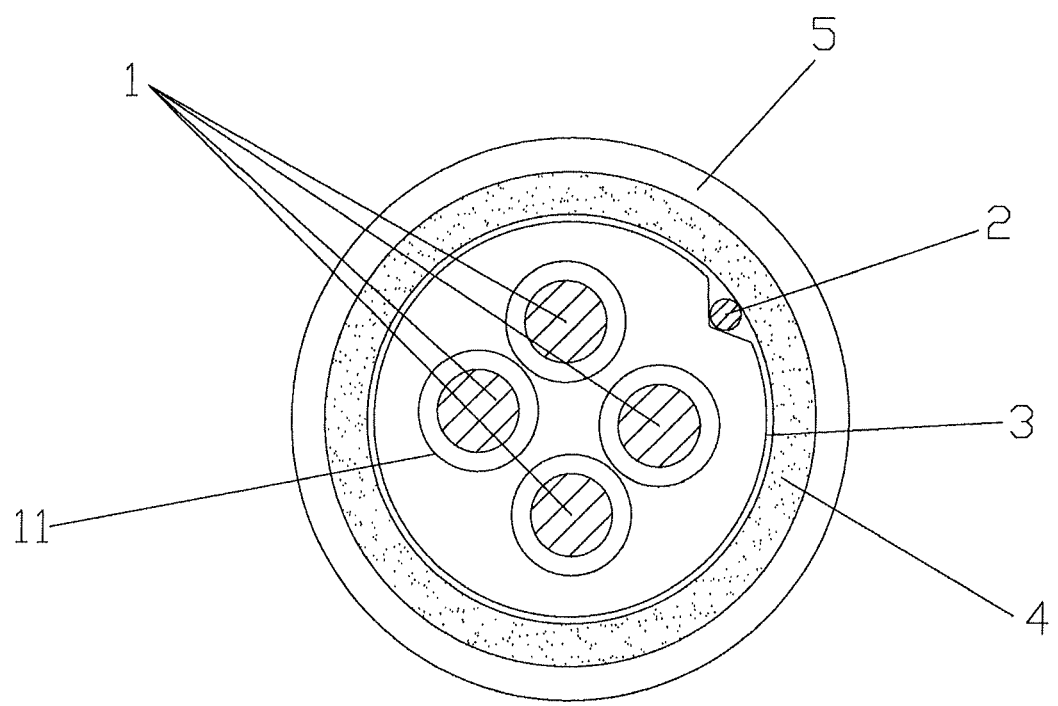

— 1 —

SIGNAL TRANSMISSION LINE DISPOSED WITH CONDUCTIVE PLASTIC MATERIAL LAYER

BACKGROUND OF THE INVENTION

1. Field of the Invention

The present invention relates to the field of signal transmission line technologies, and specifically to electromagnetic interference (EMI) protection of the signal transmission line.

2. Related Art

With the development of the modern electronic information technology, the EMI exists everywhere. The EMI directly or indirectly causes an electronic device or an electrical apparatus to generate an incorrect control signal or causes interruption of a normal control signal. In the present age, the microelectronic technical product is developed rapidly, so the EMI protection is very important. At present, the vast majority of signal transmission lines depend on a metal braid layer as a shielding layer for EMI protection. The metal braid layer has a high cost and is easily corroded, and the shielding effect is not easily controlled.

SUMMARY OF THE INVENTION

In sum, the objectives of the present invention are to solve the technical disadvantages that an existing signal transmission line has EMI, a metal braid layer as a shielding layer for EMI protection has a high cost and is easily corroded, and the shielding effect is not easily controlled, and provide a signal transmission line disposed with a conductive plastic material layer.

In order to solve the technical problems proposed in the present invention, an adopted technical solution is as follows: a signal transmission line disposed with a conductive plastic material layer, where the signal transmission line at least includes a metal wire disposed with an insulation layer, a conductive plastic material layer is disposed outside the metal wire disposed with the insulation layer, and an insulation outer coating layer is further disposed outside the conductive plastic material layer.

As a further limit to the technical solution of the present invention, the technical solution includes the following.

An isolation layer is further disposed between the outside of the metal wire disposed with the insulation layer and the conductive plastic material layer.

The isolation layer is a metal foil isolation layer or non-metal isolation layer.

More than one grounding metal wire is disposed between the isolation layer and the conductive plastic material layer or inside the isolation layer.

The metal foil isolation layer is formed through wrapping of a metal foil shielding tape.

Surface resistivity of the conductive plastic material layer is 100 to 1100 Ω/sq.

The conductive plastic material layer is a conductive PVC, PE, TPU, TPE, PP, PC or ABS layer.

The conductive plastic material layer is an electromagnetic shielding material, compositions of the conductive plastic material layer are a combination of resin and conductive carbon black, and the conductive carbon black is of: pore volume (DBP): 480-510 ml/100 g; grain size: less than 125 micrometers, 7% w/w max; content of coarse grains: 30 mg/kg max; humidity: 0.5% w/w max; volatile matter: 1.0% w/w max; iodine adsorption: 1000-1150 mg/g; ash: 0.1% w/w max; pH value: 8-10; and bulk density: 100-120 kg/m³.

Beneficial effects of the present invention are that, in the present invention, a conductive plastic material layer is used as a shielding layer for EMI protection. The conductive plastic material is also called conductive polymer plastic and has characteristics such as good conductivity and good antistatic property. Therefore, the problem for the EMI protection of the signal transmission line is effectively solved, the production cost is low, the manufacturing is easy, and surface resistivity can be controlled according to the content of an added conductive filler.

BRIEF DESCRIPTION OF THE DRAWINGS

FIG. 1 is a schematic structural cross-sectional view of the present invention.

DETAILED DESCRIPTION OF THE INVENTION

A structure of the present invention is further described with reference to the accompanying drawing and a preferred specific embodiment.

Referring to FIG. 1, the present invention includes four metal wires 1 disposed with insulation layers 11 and a grounding wire 2. During specific implementation, one or more metal wires 1 disposed with insulation layers 11 exist. In FIG. 1, four metal wires 1 are taken as an example for description. One or more grounding wires 2 may also exist. According to requirements, the grounding wire 2 may or may not be disposed. In FIG. 1, one grounding wire is taken as an example for description.

A conductive plastic material layer 4 is disposed outside the metal wires 1 disposed with the insulation layers 11 and the grounding wire 2, where the conductive plastic material layer 4 is a conductive PVC, PE, TPU, TPE, PP, PC or ABS layer. The conductive plastic material layer 4 is used for EMI protection and static electricity conduction. A conductive plastic material is generally classified into an anti-static composite material (surface resistivity 109 to 1012 Ω/sq), an electrostatic elimination composite material (surface resistivity 100 to 1100 Ω/sq), a conductive composite material (surface resistivity 100 to 1100 Ω/sq), and an electromagnetic shielding material (surface resistivity 100 to 1100 Ω/sq) according to the difference of surface resistivity. For the conductive plastic material layer 4 of the present invention, the electromagnetic shielding material (surface resistivity 100 to 1100 Ω/sq) is selected, and compositions of the conductive plastic material layer 4 are a combination of resin and conductive carbon black.

A preferred solution of the conductive carbon black is as follows: pore volume (DBP): 480-510 ml/g; grain size: less than 125 micrometers, 7% w/w max; content of coarse grains: 30 mg/kg max; humidity: 0.5% w/w max; volatile matter: 1.0% w/w max; iodine adsorption: 1000-1150 mg/g; ash: 0.1% w/w max; pH value: 8-10; and bulk density: 100-120 kg/m³. An insulation outer coating layer 5 for protecting the conductive plastic material layer 4 is further disposed outside the conductive plastic material layer 4.

During implementation, an isolation layer 3 may be additionally disposed outside the metal wires 1 disposed with the insulation layers 11 and the grounding wire 2 and in the conductive plastic material layer 4 according to requirements. During implementation, the grounding wire 2 may be disposed inside the isolation layer 3, and may also be disposed between the isolation layer 3 and the conductive plastic material layer 4. The isolation layer 3 is a metal foil isolation layer or non-metal isolation layer. For convenience of production and processing, the metal foil isolation layer or non-metal isolation layer 3 may be an isolation layer formed through wrapping of an aluminum foil shielding tape, a copper foil shielding tape, or a cotton tape.

What is claimed is:

1. A signal transmission line disposed with a conductive plastic material layer, wherein the signal transmission line at least comprises a metal wire disposed with an insulation layer, a conductive plastic material layer is disposed outside the metal wire disposed with the insulation layer, and an insulation outer coating layer is disposed outside the conductive plastic material layer, wherein the conductive plastic material layer is an electromagnetic shielding material, compositions of the conductive plastic material layer are a combination of resin and conductive carbon black, and the conductive carbon black is of: pore volume (DBP): 480-510 ml/100 g; grain size: less than 125 micrometers, 7% w/w max; content of coarse grains: 30 mg/kg max; humidity: 0.5% w/w max; volatile matter: 1.0% w/w max; iodine adsorption: 1000-1150 mg/g; ash: 0.1% w/w max; pH value: 8-10; and bulk density: 100-120 kg/m3.

2. The signal transmission line disposed with the conductive plastic material layer according to claim 1, wherein an isolation layer is disposed between an outside of the metal wire disposed with the insulation layer and the conductive plastic material layer.

3. The signal transmission line disposed with the conductive plastic material layer according to claim 2, wherein the isolation layer is a metal foil isolation layer or a non-metal isolation layer.

4. The signal transmission line disposed with the conductive plastic material layer according to claim 2, wherein more than one grounding metal wire is disposed between the isolation layer and the conductive plastic material layer or in the isolation layer.

5. The signal transmission line disposed with the conductive plastic material layer according to claim 1, wherein the metal foil isolation layer is formed through wrapping of a metal foil shielding tape.

6. The signal transmission line disposed with the conductive plastic material layer according to claim 1, wherein surface resistivity of the conductive plastic material layer is 100 to 1100 Ω/s.

7. The signal transmission line disposed with the conductive plastic material layer according to claim 1, wherein the conductive plastic material layer is a conductive PVC, PE, TPU, TPE, PP, PC or ABS layer.

\* \* \* \* \*